(12) United States Patent
Parikh et al.

(10) Patent No.: US 11,177,254 B2
(45) Date of Patent: Nov. 16, 2021

(54) STACKED TRANSISTOR DEVICE

(71) Applicant: Applied Materials, Inc., Santa Clara, CA (US)

(72) Inventors: Suketu Arun Parikh, San Jose, CA (US); Sanjay Natarajan, Portland, OR (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/599,360

(22) Filed: Oct. 11, 2019

(65) Prior Publication Data

US 2020/0118996 A1 Apr. 16, 2020

Related U.S. Application Data

(60) Provisional application No. 62/745,326, filed on Oct. 13, 2018.

(51) Int. Cl.
*H01L 27/088* (2006.01)
*H01L 21/8234* (2006.01)
*H01L 21/822* (2006.01)

(52) U.S. Cl.
CPC ........ *H01L 27/088* (2013.01); *H01L 21/8221* (2013.01); *H01L 21/823481* (2013.01)

(58) Field of Classification Search
CPC ........... H01L 27/088; H01L 21/823481; H01L 21/8221; H01L 21/823487; H01L 27/0688
See application file for complete search history.

(56) References Cited

U.S. PATENT DOCUMENTS

| | | | |
|---|---|---|---|
| 7,679,133 B2* | 3/2010 | Son | H01L 27/11568 257/328 |
| 8,441,059 B2* | 5/2013 | Sim | H01L 27/11551 257/324 |
| 8,971,118 B2 | 3/2015 | Jin et al. | |
| 9,653,311 B1 | 5/2017 | Ahn et al. | |
| 9,679,946 B2 | 6/2017 | Shepard | |
| 2012/0119287 A1 | 5/2012 | Park et al. | |
| 2017/0053906 A1 | 2/2017 | Or-Bach et al. | |
| 2017/0200676 A1 | 7/2017 | Jeong et al. | |
| 2017/0221884 A1 | 8/2017 | Machkaoutsan et al. | |
| 2018/0315758 A1 | 11/2018 | Yoo et al. | |
| 2019/0355717 A1* | 11/2019 | Zhou | H01L 21/823828 |

FOREIGN PATENT DOCUMENTS

KR 20110015338 A 2/2011

OTHER PUBLICATIONS

PCT International Search Report and Written Opinion in PCT/US2019/055799 dated Jan. 31, 2020, 9 pages.

* cited by examiner

*Primary Examiner* — David Vu
(74) *Attorney, Agent, or Firm* — Servilla Whitney LLC

(57) ABSTRACT

Logic devices and methods of forming logic devices are described. An epitaxial channel is formed orthogonally to a horizontal plane of a substrate surface with a stack or horizontal transistors on the substrate surface. The first horizontal transistor having a first length and a first step, the second horizontal transistor having a second length and a second step and a third horizontal transistor has a third length and a third step. Each of the horizontal transistors is separated from adjacent layers by a horizontal isolation layer.

17 Claims, 11 Drawing Sheets

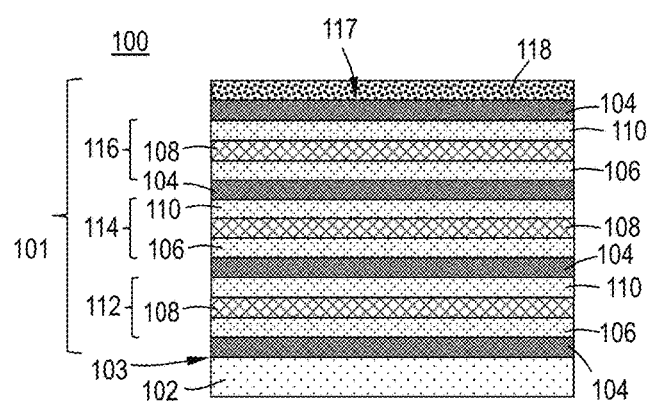
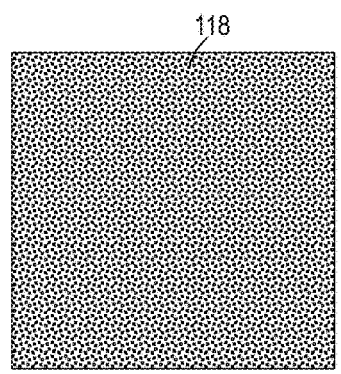
FIG. 1A
FIG. 1B
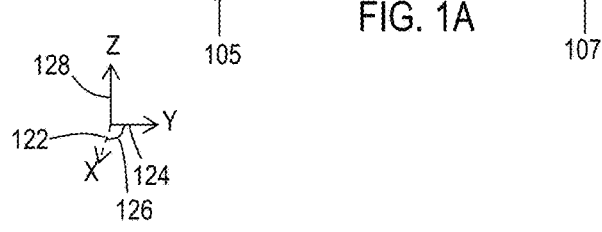
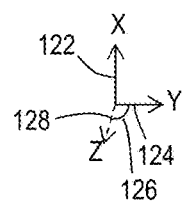
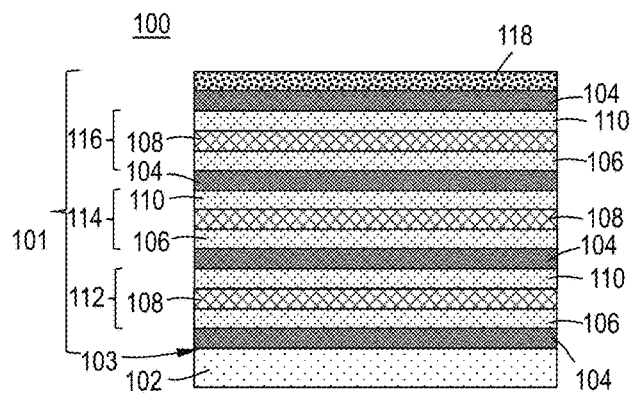
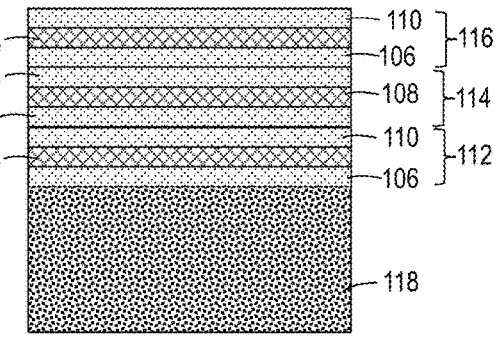
FIG. 2A
FIG. 2B

STACKED TRANSISTOR DEVICE

CROSS-REFERENCE TO RELATED APPLICATIONS

This application claims priority to U.S. Provisional Application No. 62/745,326, filed Oct. 13, 2018, the entire disclosure of which is hereby incorporated by reference herein.

TECHNICAL FIELD

Embodiments of the present disclosure pertain to the field of electronic device manufacturing, and in particular, to transistors. More particularly, embodiments of the disclosure are directed to stacked transistor devices and methods of manufacturing stacked transistor devices.

BACKGROUND

Integrated circuits have evolved into complex devices that can include millions of transistors, capacitors, and resistors on a single chip. In the course of integrated circuit evolution, functional density (i.e., the number of interconnected devices per chip area) has generally increased while geometry size (i.e., the smallest component (or line) that can be created using a fabrication process) has decreased.

Transistors are circuit components or elements that are often formed on semiconductor devices. Many transistors may be formed on a semiconductor device in addition to capacitors, inductors, resistors, diodes, conductive lines, or other elements, depending on the circuit design. Integrated circuits incorporate planar field-effect transistors (FETs) in which current flows through a semiconducting channel between a source and a drain, in response to a voltage applied to a control gate.

As device dimensions have shrunk, device geometries and materials have experienced difficulty maintaining switching speeds without incurring failures. Several new technologies emerged that allowed chip designers to continue shrinking gate lengths. One particularly far-reaching technology change entailed re-designing the structure of the FET from a planar device to a three-dimensional device in which the semiconducting channel was replaced by a fin that extends out from the plane of the substrate. In such a device, commonly referred to as a FinFET, the control gate wraps around three sides of the fin so as to influence current flow from three surfaces instead of one. The improved control achieved with a 3-D design results in faster switching performance and reduced current leakage. Building taller devices has also permitted increasing the device density within the same footprint that had previously been occupied by a planar FET.

The FinFET concept was extended by development of a gate all-around FET (GAA FET), in which the gate fully wraps around the channel for maximum control of the current flow therein. In the GAA FET, the channel can take the form of a cylindrical nanowire that is isolated from the substrate. Existing GAA FETs are oriented horizontally, such that the nanowire extends in a direction that is parallel to the surface of the semiconductor substrate.

The FinFET concept was further extended by development of a vertical gate all-around FET (vGAA FET), in which a current-carrying nanowire is oriented perpendicular to the surface of the semiconductor substrate. In terms of scaling, however, the amount of area used in a vGAA FET is prohibitive. Thus, there is a need for multi-level scaling without requiring enhanced geometries.

SUMMARY

One or more embodiments are directed to logic devices and methods of manufacturing logic devices. In one or more embodiments, a logic device comprises a substrate having a surface defining a horizontal plane; an epitaxial channel formed orthogonally to the horizontal plane of the substrate surface, the epitaxial channel having a height extending above the substrate surface and a length extending along a first direction of the horizontal plane, the epitaxial channel having a first side and a second side; and a stack of horizontal transistors on the substrate surface comprising a first horizontal transistor having a first length and a first step, a second horizontal transistor having a second length and a second step, and a third horizontal transistor having a third length and a third step, each of the horizontal transistors separated from adjacent layers by a horizontal isolation layer.

In one or more embodiments, a logic device comprises a substrate having a surface defining a horizontal plane; an epitaxial channel formed orthogonally to the horizontal plane of the substrate surface, the epitaxial channel having a height extending above the substrate surface and a length extending along a first direction of the horizontal plane, the epitaxial channel having a first side and a second side; and a stack of horizontal transistors on the substrate surface in contact with the first side or second side of the epitaxial channel, each of the horizontal transistors having a length extending from a first end of the horizontal transistor along the first direction to a second end of the horizontal transistor, the length of each of the horizontal transistors decreasing with increasing distance from the substrate surface.

In one or more embodiments, a method of forming a logic device comprises: providing a substrate having a surface defining a horizontal plane with a stack of pre-transistor layers, each pre-transistor layer comprising a first film, a dummy gate and a second film, each pre-transistor layer separated from adjacent layers by a pre-isolation layer, the first film and second film etch selective relative to the dummy gate and pre-isolation layer and the dummy gate etch selective to the pre-isolation layer; forming an opening in the stack of pre-transistor layers to expose the surface of the substrate; forming an epitaxial channel in the opening from the substrate surface to a top of the stack of pre-transistor layers; forming a isolation trench in the stack of pre-transistor layers spaced from the epitaxial channel to expose the surface of the substrate; replacing the pre-isolation layers with an isolation layer; replacing the dummy gate with a high-k/metal gate; and replacing the first film and the second film with a source/drain material.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

FIG. 1A illustrates a cross-section view of a logic device according to one or more embodiments of the disclosure;

FIG. 1B illustrates a top view of a logic device according to one or more embodiments of the disclosure;

FIG. 2A illustrates a cross-section view of a logic device according to one or more embodiments of the disclosure;

FIG. 2B illustrates a top view of a logic device according to one or more embodiments of the disclosure;

DETAILED DESCRIPTION

Figure 2C:
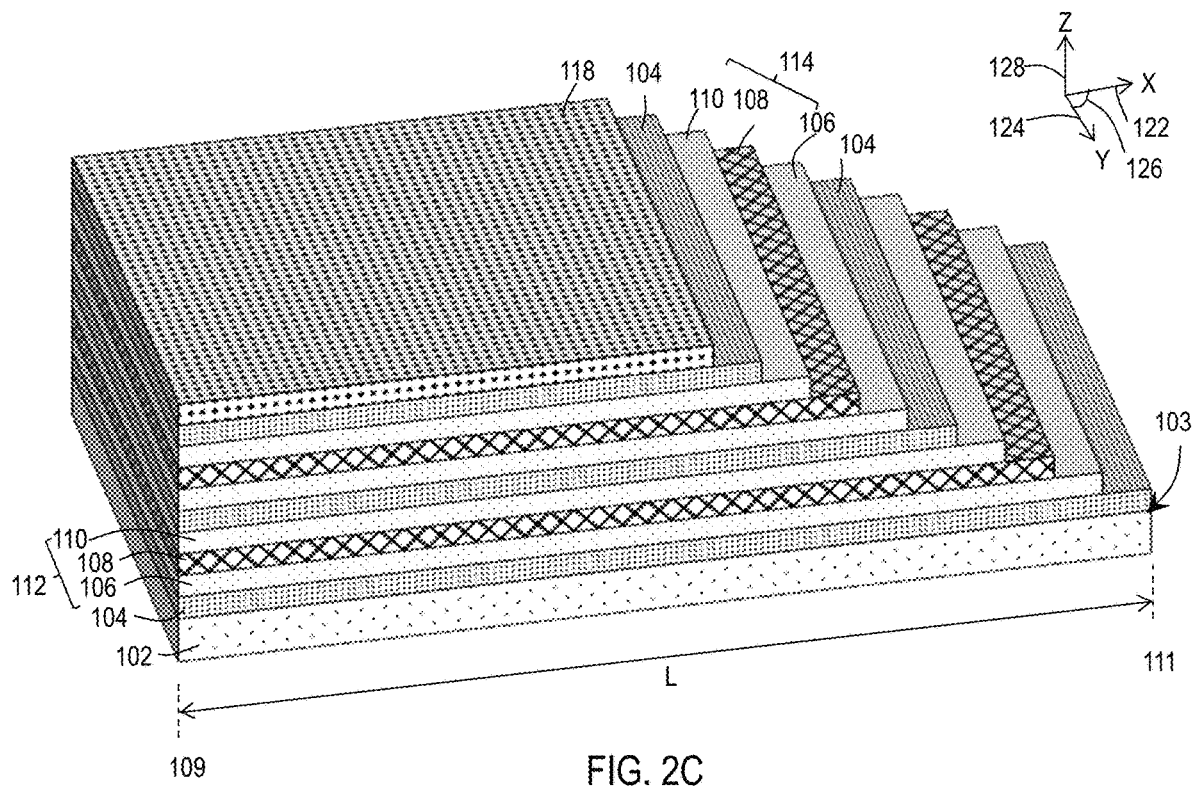
FIG. 2C illustrates a parallel projection view of a logic device according to one or more embodiments of the disclosure.

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Transistors are circuit components or elements that are often formed on semiconductor devices. Depending upon the circuit design, in addition to capacitors, inductors, resistors, diodes, conductive lines, or other elements, transistors are formed on a semiconductor device. Generally, a transistor includes a gate formed between source and drain regions. In one or more embodiments, the source and drain regions include a doped region of a substrate and exhibit a doping profile suitable for a particular application. The gate is positioned over the channel region and includes a gate dielectric interposed between a gate electrode and the channel region in the substrate.

As used herein, the term "field effect transistor" or "FET" refers to a transistor that uses an electric field to control the electrical behavior of the device. Field effect transistors generally display very high input impedance at low temperatures. The conductivity between the drain and source terminals is controlled by an electric field in the device, which is generated by a voltage difference between the body and the gate of the device. The FET's three terminals are source (S), through which the carriers enter the channel; drain (D), through which the carriers leave the channel; and gate (G), the terminal that modulates the channel conductivity. Conventionally, current entering the channel at the source (S) is designated $I_S$ and current entering the channel at the drain (D) is designated $I_D$. Drain-to-source voltage is designated $V_{DS}$. By applying voltage to gate (G), the current entering the channel at the drain (i.e. $I_D$) can be controlled.

The metal-oxide-semiconductor field-effect transistor (MOSFET) is a type of field-effect transistor (FET). It has an insulated gate, whose voltage determines the conductivity of the device. This ability to change conductivity with the amount of applied voltage is used for amplifying or switching electronic signals. A MOSFET is based on the modulation of charge concentration by a metal-oxide-semiconductor (MOS) capacitance between a body electrode and a gate electrode located above the body and insulated from all other device regions by a gate dielectric layer. Compared to the MOS capacitor, the MOSFET includes two additional terminals (source and drain), each connected to individual highly doped regions that are separated by the body region. These regions can be either p or n type, but they use both be of the same type, and of opposite type to the body region. The source and drain (unlike the body) are highly doped as signified by a "+" sign after the type of doping.

If the MOSFET is an n-channel or nMOS FET, then the source and drain are n+ regions and the body is a p region. If the MOSFET is a p-channel or pMOS FET, then the source and drain are p+ regions and the body is a n region. The source is so named because it is the source of the charge carriers (electrons for n-channel, holes for p-channel) that flow through the channel; similarly, the drain is where the charge carriers leave the channel.

As used herein, the term "fin field-effect transistor (Fin-FET)" refers to a MOSFET transistor built on a substrate where the gate is placed on two, three, or four sides of the channel or wrapped around the channel, forming a double gate structure. FinFET devices have been given the generic name FinFETs because the source/drain region forms "fins" on the substrate. FinFET devices have fast switching times and high current density.

As used herein, the term "gate all-around (GAA) FETs," sometimes called the lateral nanowire FET, is used to refer to a FinFET in which the gate material surrounds the channel region on all sides. In one or more embodiments, GAA transistors provide better electrostatics than FinFETs, allowing for additional gate length scaling. Depending on design, gate all-around FETs can have two or four effective gates.

The embodiments of the disclosure are described by way of the Figures, which illustrate devices (e.g. transistors) and processes for forming transistors in accordance with one or more embodiments of the disclosure. The processes shown are merely illustrative possible uses for the disclosed processes, and the skilled artisan will recognize that the disclosed processes are not limited to the illustrated applications.

One or more embodiments of the disclosure provide logic devices and processing for forming said logic devices. The logic devices of one of more embodiments advantageously use less area than conventional GAA and vGAA. Some embodiments of the disclosure provide logic devices which enable vertical scaling, increasing density and performance.

Embodiments of the disclosure provide electronic devices with vertically stacked transistors. The transistors are built on top of each other so that any number from 2 to n transistors (n=2 to 50, or more) can be formed. Each of the transistors is isolated from adjacent transistors with shallow trench isolation (STI). The vertically stacked transistors are connected (source/drain and gate) using a staircase approach. Embodiments of the disclosure can advantageously increase the density of transistors by stacking with a slight increase in area per stacked transistor by more steps in a terrace. Embodiments of the disclosure may also provide less stringent features by vertical scaling, defining critical dimensions (e.g., gate length) with film thickness.

Some embodiments of the disclosure advantageously provide architecture for logic devices that allow for stacked transistors which are individually connected to source/drain and gate using a terraced formation on an ONC stack (oxide, nitride, carbide). Connecting separate gate/source/drain from each side of a channel, which can be isolated at contacts using slit etch across terraces, can double the density of the devices.

Some embodiments of the disclosure comprise transistors using vertical epitaxial channels grown in a contact slot into a stack of silicon oxide/silicon nitride/silicon carbide layers (referred to as three color or ONCNO). The oxide (O) layer can be shallow trench isolation (STI). The nitride (N) layer can be the source/drain and the carbide (C) layer can be a gate layer. The films can be changed in varying combinations as well as other films like aluminum oxide (also referred to as AlO or $Al_2O_3$), hafnium oxide (also referred to as HfO, $HfO_x$ or $HfO_2$), or tungsten. The skilled artisan will recognize that films referred to by atomic composition are not limited to the stoichiometric ratios enumerated. For example, an aluminum oxide film comprises aluminum and oxygen atoms in an appropriate ratio. Even where $Al_2O_3$, or other compound, is used, the skilled artisan will recognize that the stoichiometry included in the compound formula is an idealized ratio. Actual films can vary from the idealized ratios without deviating from the scope of the disclosure. The carbide (C) films thickness can be used to define the gate lengths in some embodiments.

Formation of epitaxial channels can use silicon epitaxy for NMOS and PMOS or silicon (Si) and silicon germanide (SiGe) for NMOS, PMOS, respectively. The epitaxial channel can be formed in an etched slot, as described below and understood by the skilled artisan. The slot length can define the width of the gate. Slots can be opened to allow for gate, source/drain to connect to the channel. Isolation can be created by recessing the vertical channel in one of the layer of the ONC (e.g., the oxide layer). A high-k gate can be created by selectively removing one of the layers (e.g., the nitride layer). A thermal oxide, sidewall spacer, high-k and metal gate can be formed as understood by the skilled artisan. The source/drain contact can be created by selectively removing one of the ONC layers (e.g., the carbide layer). A vertical spacer can be inserted by selective deposition on a dielectric adjacent the epitaxial channel. Titanium, titanium silicide, and the like, can be deposited using an anneal followed by cobalt, ruthenium, molybdenum, tungsten, etc., for contacts.

The logic device 100 of one or more embodiments can be referred to as a transistor, a transistor gate, a logic device, and the like. The individual components of the logic device 100, including the semiconductor substrate 102, the source material 206, the drain material 210, the channel 122, and the gate 208 can be formed by any suitable process or processes known to the skilled artisan. FIGS. 1A-15 illustrate a logic device (e.g. a transistor) and a method of manufacturing a logic device according to one or more embodiments of the disclosure.

FIG. 1A is a cross-sectional view of a logic device 100 according to one or more embodiments. FIG. 1B is a top view of a logic device 100 of FIG. 1A. With reference to FIGS. 1A and 1B, a substrate 102 is provided having a surface 103 defining a horizontal plane. As used in this specification and the appended claims, the term "horizontal" means a plane formed by a top surface 103 of the substrate. A horizontal plane does not have a particular spatial orientation relative to the pull of gravity. The horizontal plane can also be referred to as the x-y plane, which is the plane formed by the intersection of the X-axis (direction) 122 and the Y-axis (direction) 124. In FIG. 1A, the X-axis (direction) 122 extends orthogonally to the plane of the Figure page. The X-axis (direction) 122 crosses the Y-axis (direction) 124 at an angle 126. In one or more embodiments, the angle 126 is about 90 degrees. In another embodiment, angle 126 is an angle that is other than a 90 degree angle. In FIG. 1A, the cross-sectional view shows a "vertical" stack of layers. The cross-sectional view is a slice taken along the y-z plane. As used in this specification and the appended claims, the term "vertical" means along an axis normal to the horizontal plane of the substrate surface 103.

The semiconductor substrate 102 can be any suitable substrate material. In one or more embodiments, the semiconductor substrate 102 comprises a semiconductor material, e.g., silicon (Si), carbon (C), germanium (Ge), silicon germanium (SiGe), gallium arsenide (GaAs), indium phosphate (InP), indium gallium arsenide (InGaAs), indium aluminum arsenide (InAlAs), germanium (Ge), silicon germanium (SiGe), copper indium gallium selenide (CIGS), other semiconductor materials, or any combination thereof. In one or more embodiments, the semiconductor substrate 102 comprises one or more of silicon (Si), germanium (Ge), gallium (Ga), arsenic (As), indium (In), phosphorus (P), copper (Cu), or selenium (Se). Although a few examples of materials from which the substrate may be formed are described herein, any material that may serve as a foundation upon which passive and active electronic devices (e.g., transistors, memories, capacitors, inductors, resistors, switches, integrated circuits, amplifiers, optoelectronic devices, or any other electronic devices) may be built falls within the spirit and scope of the present invention.

In one or more embodiments, the substrate 102 has a stack 101 of pre-transistor layers 112, 114, 116, thereon. As used herein, the term "stack of pre-transistor layers" refers to a vertical arrangement of layers that will form a plurality of transistors to form the logic device 100. In one or more embodiments, the term "stack" refers to the presence of more than one pre-transistor layer placed one on top of the other.

In the embodiments illustrated in FIGS. 1A-15, three pre-transistor layers 112, 114, 116 are shown, and, thus, the stack 101 comprises three pre-transistor layers. While the illustrated embodiment has three pre-transistor layers 112, 114, 116, there can be any suitable number of pre-transistor layers. In some embodiments, there are two or more pre-transistor layers. In some embodiments, there are greater than or equal to 2, 3, 4, 5, 6, 7, 8, 9, 10, 15, 20, 25, 30, 35, 40, 45, 50, 60, 70, 80, 90 or 100 pre-transistor layers. As recognized by one of skill in the art, additional pre-transistor layers can be formed on the top surface of the pre-transistor layer 116 such that the stack 101 comprises any number n of pre-transistor layers. In one or more embodiments, the stack 101 of pre-transistor layers 112, 114, 116 has a height measured along the Z-axis (direction) 128, a width measured along the Y-axis (direction) 124, and a length measured along the X-axis (direction) 122.

Conventionally, a transistor comprises a gate located between opposing source/drain regions. The conventional transistor is aligned along the Y-axis (direction) 124, such that a bottom surface of the gate and the bottom surfaces of the opposing source/drain regions sit on the Y-axis (direction) 124. In one or more embodiments, the logic device 100 comprises transistors that are aligned along the Z-axis (direction) 128, such that a first side 105 of the gate and a first side 105 of the opposing source/drain regions sit on the Z-axis (direction) 128, and a second side 107 of the gate and second side 107 of the opposing source/drain regions sit on the Y-axis direction. In this sense, the transistors (and pre-transistor layers) are oriented horizontally along the Y-axis (direction) 124, and are stacked one of top of the other vertically along the Z-axis (direction) 128 to form a stack 101 of pre-transistor layers 112, 114, 116. As used in this specification and the appended claims, the term "horizontal transistor" refers to a transistor in which the source, gate and drain are stacked so that each layer is further from the substrate than the previous layer.

Each pre-transistor layer 112, 114, 116 comprises a first film 106, a dummy gate 108, and a second film 110. Each pre-transistor layer 112, 114, 116 is separated from adjacent layers by a pre-isolation layer 104.

In one or more embodiments, the first film 106 and the second film 110 are etch selective relative to the dummy gate 108 and the pre-isolation layer 104. In one or more embodiments, the dummy gate 108 is etch selective relative to the pre-isolation layer 104. In one or more embodiments, a capping layer 118 is on a top surface 117 of the stack 101 of pre-transistor layers 112, 114, 116.

In one or more embodiments, the first film 106 and the second film 110 comprise silicon oxide. In some embodiments, the first film 106 and the second film 110 comprise aluminum oxide. In some embodiments, the first film 106 and the second film 110 comprise silicon nitride.

The pre-isolation layer 104 is any material that can separate the pre-transistor layers 112, 114, 116 and allows selective etching and removal processes. In one or more embodiments, the pre-isolation layer 104 comprises silicon carbide.

In one or more embodiments, the dummy gate 108 can be made of any suitable material known to the skilled artisan. In one or more embodiments, the dummy gate 108 comprises one or more of silicon nitride, polycrystalline silicon, amorphous silicon, microcrystalline silicon, or the like.

With reference to FIG. 1B, a top view of the logic device 100 shows the capping layer 114.

FIG. 2A is a cross-section view of the logic device 100 according to one or more embodiments. FIG. 2B is a top view of the logic device of FIG. 2A. FIG. 2C is a parallel projection view of the logic device 100 of FIG. 2A. For illustrative purposes the pre-transistor layer 116 shown in FIG. 2A is omitted. Referring to FIGS. 2A-2C, a terraced etch process of the logic device of FIG. 1A is performed. The terraced etch process can be any terrace etching process known to one of skill in the art. In one or more embodiments, the terrace etch process comprises a sequence of masking and etching in incremental steps to create a stair-like logic device. Referring to FIG. 2C, the stack 101 of pre-transistor layers 112, 114 has a first end 109 and a second end 111 defining a length L. A stepped region at the second end 111 of each pre-transistor layer 112, 114 is formed such that the length L of each pre-transistor layer 112, 114 decreases with increasing distance from the horizontal plane of the substrate surface 103.

Figure 2D:
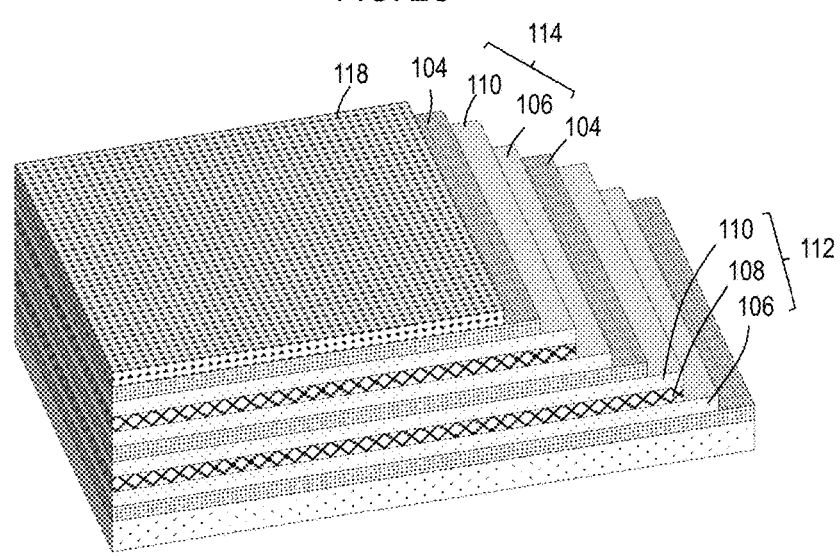
FIG. 2D illustrates a parallel projection view of a logic device according to one or more embodiments of the disclosure.

The embodiment illustrated in FIG. 2C shows each of the first film 106, dummy gate 108 and second film 110 as separate steps in the pre-transistor layers 112, 114. In some embodiments, as shown in FIG. 2D, the dummy gate 108 is etched at the same time as the second film 110 so that there is one step between the first film 106 and the second film 110 with the dummy gate 108 ending at the same point as the second film 110. The dummy gate 108 is not exposed as a separate step in the stair-like formation.

In the embodiment illustrated in FIG. 2C, each of the layers above the substrate 102, including the pre-isolation layers 104. In this configuration, each of the individual horizontal layers can be contact separately on the step portion. The staircase can also be non-uniform so that the pre-isolation layers 104 do not provide a separate step portion at the second end 111. The non-uniform staircase pattern may be beneficial in that there are fewer mask-etch processes used.

Figure 3A:
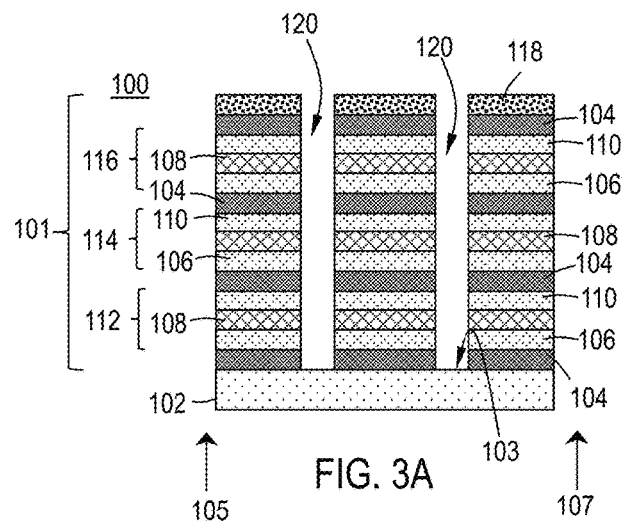
FIG. 3A illustrates a cross-section view of a logic device according to one or more embodiments of the disclosure.
Figure 3B:
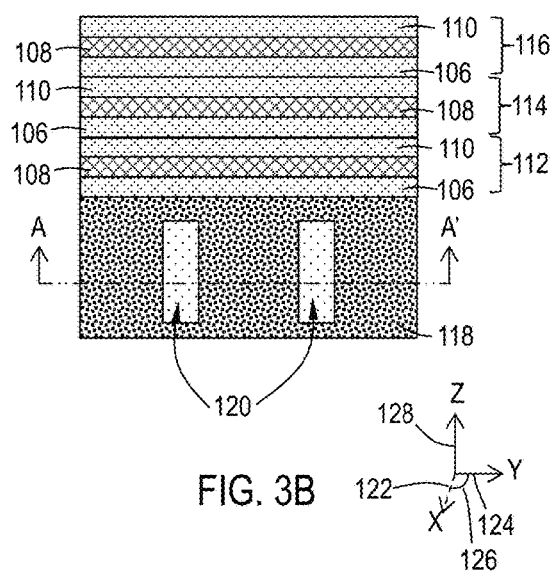
FIG. 3B illustrates a top view of a logic device according to one or more embodiments of the disclosure.

FIG. 3A is a cross-sectional view of the logic device 100 of FIG. 2A after a vertical etch process. FIG. 3B is a top view of the logic device of FIG. 3A. With reference of FIGS. 3A and 3B, an opening 120 is formed in (or through) the stack 101 of pre-transistor layers 112, 114, 116 to expose the surface 103 of the substrate 102. The opening 120 may be formed by any suitable method known to one of skill in the art. In one or more embodiments, the opening 120 is formed by masking and etching. The opening 120 can have any suitable width along the Y-axis (direction) 124.

Figure 3C:
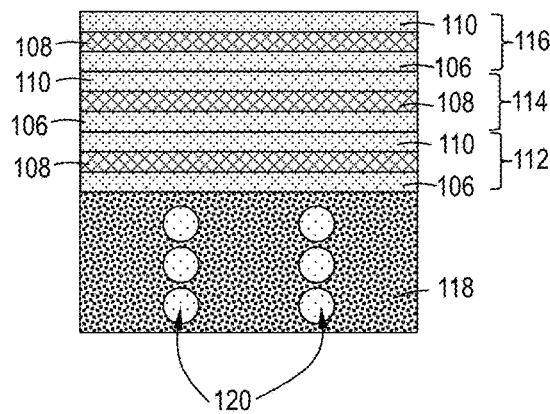
FIG. 3C illustrates a top view of a logic device according to one or more embodiments of the disclosure.
Figure 4A:
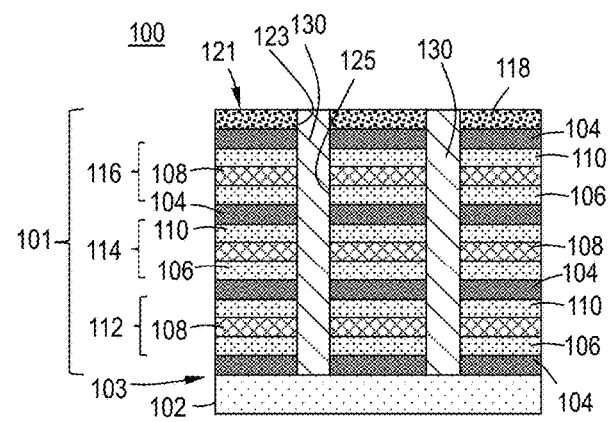
FIG. 4A illustrates a cross-section view of a logic device according to one or more embodiments of the disclosure.

The embodiments illustrated in FIGS. 3A and 3B and FIG. 4A onward are based on a rectangular opening 120 formed by providing a mask with a rectangular opening and etching through the rectangular opening. FIG. 3C shows an alternate embodiment in which the rectangular opening is replaced with circular openings 120 are formed in capping layer 118. The remaining description and Figures refer to a rectangular opening; however, the skilled artisan will recognize that the process can be performed with the circular openings of FIG. 3C.

Figure 4B:
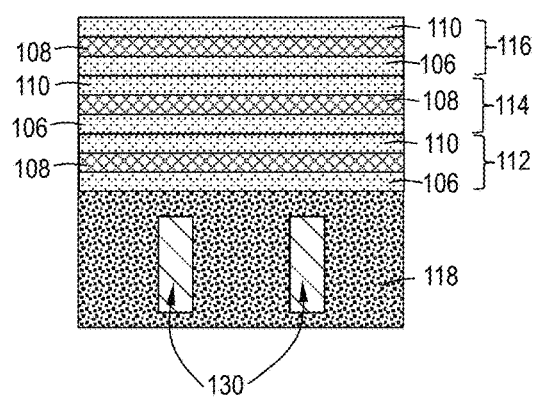
FIG. 4B illustrates a top view of a logic device according to one or more embodiments of the disclosure.

FIG. 4A is a cross-sectional view of a logic device 100 according to one or more embodiments, and FIG. 4B is a top view of the logic device of FIG. 4A. With reference of FIGS. 4A and 4B, a channel 130 is formed in the opening 120 from the surface 103 of the substrate 102 to a top 121 of the stack 101 of pre-transistor layers 112, 114, 116. The channel 130 follows the contours of the opening 120 and has a first side 123 and a second side 125. In one or more embodiments, the channel 130 comprises a semiconducting nanostructure (e.g. semiconducting nanowire, a semiconducting nanosheet, a semiconducting carbon nanotube, or the like). In one or more embodiments, the semiconducting nanowire and/or the semiconducting nanosheet and/or the semiconducting carbon nanotube is an epitaxially grown nanowire and/or an epitaxially grown nanosheet and/or an epitaxially grown nanotube.

As used herein, the term "nanowire" refers to a nanostructure, with a diameter on the order of a nanometer ($10^{-9}$ meters). Nanowires can also be defined as the ratio of the length to width being greater than 1000. Alternatively, nanowires can be defined as structures having a thickness or diameter constrained to tens of nanometers or less and an unconstrained length. Nanowires are used in transistors and some laser applications, and, in one or more embodiments, are made of semiconducting materials, metallic materials, insulating materials, superconducting materials, or molecular materials. In one or more embodiments, nanowires are used in transistors for logic CPU, GPU, MPU, and volatile (e.g. DRAM) and non-volatile (e.g. NAND) devices. As used herein, the term "nanosheet" refers to a two-dimensional nanostructure with a thickness in a scale ranging from about 0.1 nm to about 1000 nm.

In one or more embodiments, the channel 130 comprises an epitaxially grown material. As used herein, the term "epitaxial" refers to the deposition of a crystalline overlayer on a crystalline substrate. The crystalline overlayer is called an epitaxial layer. Epitaxial layers can be grown from gaseous or liquid precursors. In one or more embodiments, the epitaxial channel 130 comprises an epitaxially grown material selected from one or more of silicon, indium phosphate, germanium, silicon germanium, gallium arsenide, and the like.

In one or more embodiments, not illustrated, the channel 130 is formed with an overburden, which may be removed by any planarization, etching, or polishing technique known to one of skill in the art.

In one or more embodiments, dopants are pre-implanted into the channel 130 to define a p-well or n-well epitaxial channel. In one or more embodiments, the dopant is selected from one or more of boron (B), arsenic (As), phosphorous (P), antimony (Sb), aluminum (Al), gallium (Ga), selenium (Se), tellurium (Te), magnesium (Mg), zinc (Zn), cadmium (Cd), silicon (Si), germanium (Ge), and the like.

Figure 5A:
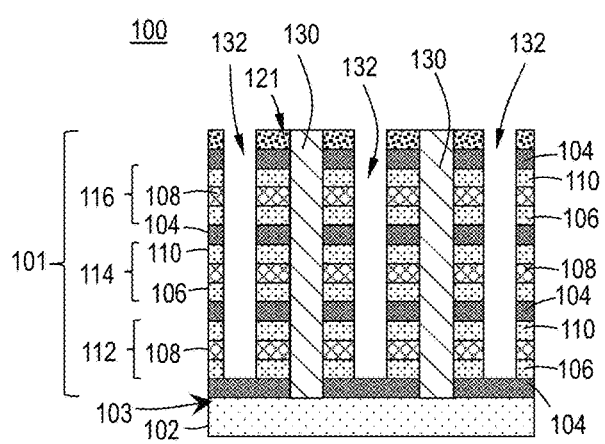
FIG. 5A illustrates a cross-section view of a logic device according to one or more embodiments of the disclosure.
Figure 5B:
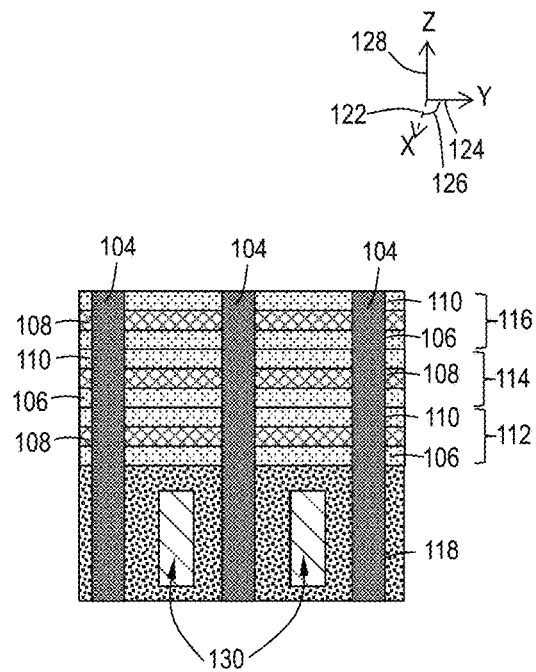
FIG. 5B illustrates a top view of a logic device according to one or more embodiments of the disclosure.

FIG. 5A is a cross-sectional view of a logic device according to one or more embodiments, and FIG. 5B is a top view of the logic device of FIG. 5A. With reference of FIGS. 5A and 5B, an isolation trench 132 is formed in the stack 101 of pre-transistor layers 112, 114, 116 spaced from the channel 130 to expose the surface 103 of the substrate 102.

The isolation trench 132 may be formed by any method known to one of skill in the art. In one or more embodiments, the isolation trench 132 is formed by lithography or masking and etching.

Figure 6:
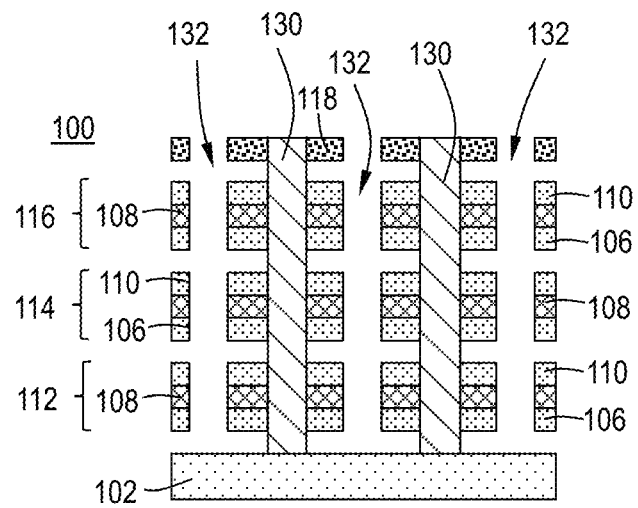
FIG. 6 illustrates a cross-section view of a logic device according to one or more embodiments of the disclosure.
Figure 7:
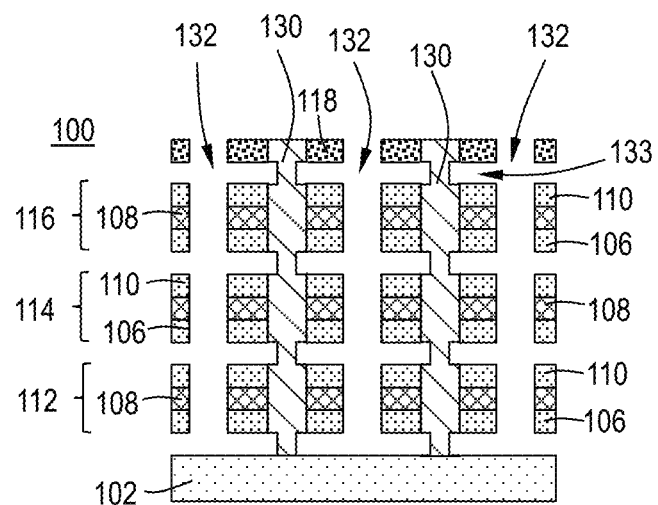
FIG. 7 illustrates a cross-section view of a logic device according to one or more embodiments of the disclosure.

FIG. 6 is a cross-sectional view of a logic device according to one or more embodiments after removal of the pre-isolation layer 104. FIG. 7 is a cross-sectional view of a logic device according to one or more embodiments. With reference of FIG. 7, the channel 130 is undercut to form a gap 133 in the channel 130. The pre-isolation layer 104 may be removed and undercut by any method known to one of skill in the art. In one or more embodiments, the pre-isolation layer 104 is removed and undercut by selectively etching the pre-isolation layer 104 to a depth extending to at least a surface of the epitaxial channel 130 to form a gap 133. In one or more embodiments, the channel 130 is undercut partially, as illustrated, such that a portion of the channel 130 remains. In other embodiments, not illustrated, the channel 130 is undercut fully such that the channel 130 is removed. In some embodiments, removal of the pre-isolation layer 104 and undercutting are performed in separate processes.

Figure 8:
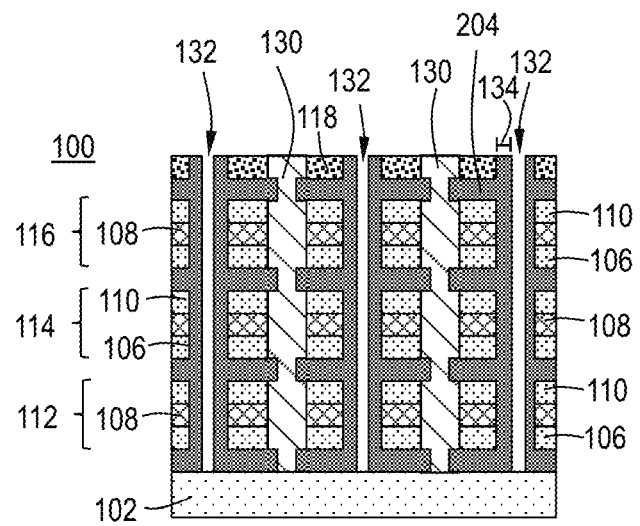
FIG. 8 illustrates a cross-section view of a logic device according to one or more embodiments of the disclosure.

FIG. 8 is a cross-sectional view of a logic device according to one or more embodiments. With reference of FIG. 8, an isolation layer 204 is formed in the gap 133. In one or more embodiments, the isolation layer 204 may be deposited by any deposition method know of one of skill in the art including, but not limited to, ALD, CVD, and the like. In one or more embodiments, the isolation layer 204 comprises a thermal oxide film. As illustrated in FIG. 8, in one or more embodiments, the isolation layer 204 is deposited in the gap 133 forming an overburden 134 of the isolation layer 204. In some embodiments, the isolation layer 204 is formed by a conformal deposition process in which the gaps 133 are filled.

Figure 9:
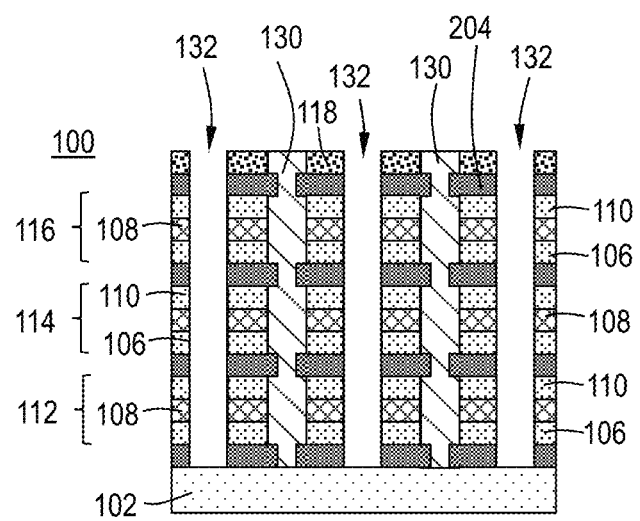
FIG. 9 illustrates a cross-section view of a logic device according to one or more embodiments of the disclosure.

FIG. 9 is a cross-sectional view of a logic device according to one or more embodiments. With reference of FIG. 9, the overburden 134 of the isolation layer 204 is removed. The overburden 134 can be removed by any suitable technique known to one of skill in the art such that the isolation layer 204 is substantially coplanar with the side of the isolation trench. In some embodiments, the overburden 134 is removed by a selective anisotropic etching or by masking and etching. In other embodiments, the overburden 134 of isolation layer 204 is removed at a later stage in processing to limit time and costs.

Figure 10:
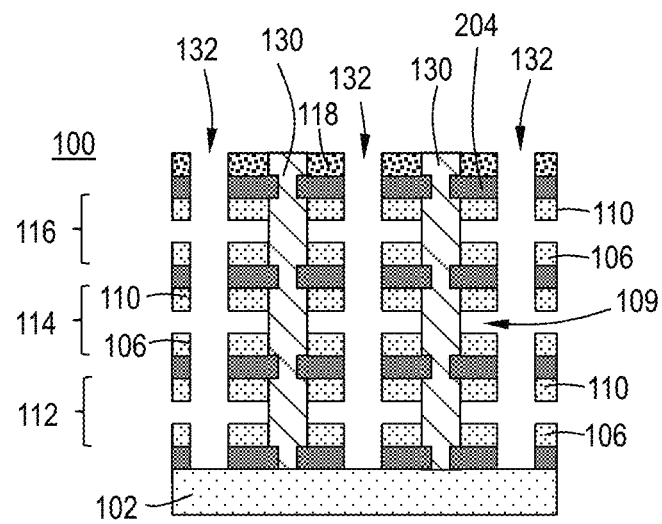
FIG. 10 illustrates a cross-section view of a logic device according to one or more embodiments of the disclosure.

FIG. 10 is a cross-sectional view of a logic device according to one or more embodiments. With reference of FIG. 10, the dummy gate 108 is removed. In one or more embodiments, the dummy gate 108 is removed by any suitable process known to the skilled artisan. In one or more embodiments, the dummy gate 108 is removed by selectively etching the dummy gate 108 to form a dummy gate opening 109.

Figure 11:
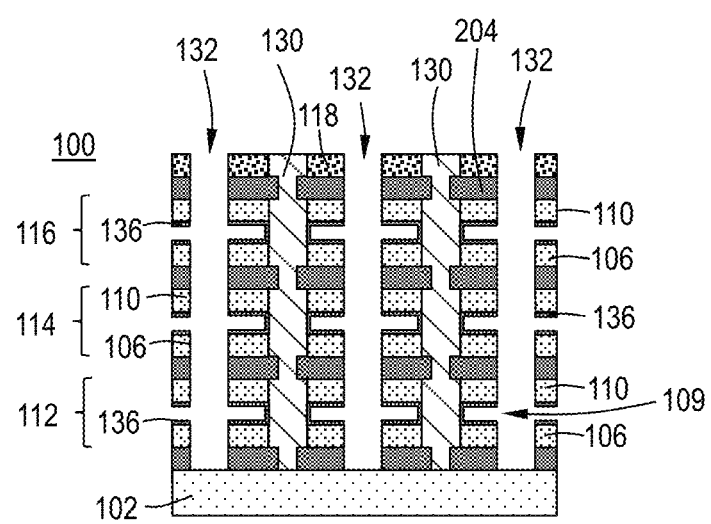
FIG. 11 illustrates a cross-section view of a logic device according to one or more embodiments of the disclosure.

FIG. 11 is a cross-sectional view of a logic device according to one or more embodiments. With reference of FIG. 11, a conformal high-κ dielectric layer 136 is deposited in the gate opening 109. The high-κ dielectric layer 136 can be any suitable high-κ dielectric material known to the skilled artisan. In one or more embodiments, the high-κ dielectric layer 136 comprises hafnium oxide or a lanthanum (La) doped high-κ dielectric.

Figure 12:
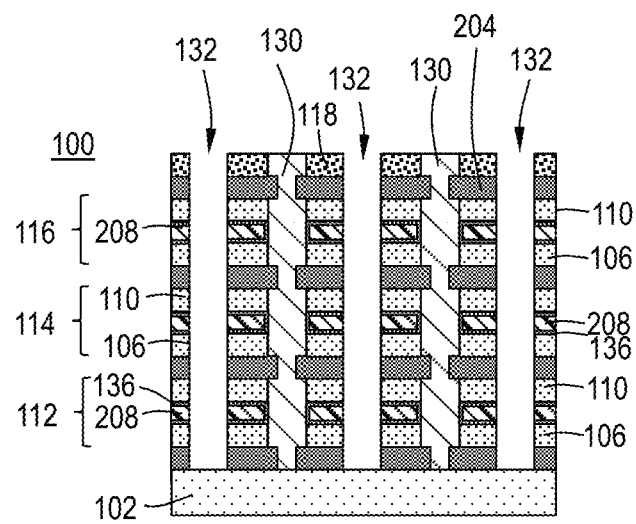
FIG. 12 illustrates a cross-section view of a logic device according to one or more embodiments of the disclosure.

FIG. 12 is a cross-sectional view of a logic device according to one or more embodiments. With reference of FIG. 12, after the high-κ dielectric layer 136 is deposited, the gate opening 109 is filled with a gate metal to form a gate 208. The gate 124 can be made of any suitable material known to the skilled artisan. In one or more embodiments, the gate 208 comprises a gate metal selected from one or more of copper (Cu), cobalt (Co), tungsten (W), titanium (Ti), molybdenum (Mo), nickel (Ni), ruthenium (Ru), silver (Ag), gold (Au), iridium (Ir), or platinum (Pt). In one or more specific embodiments, the gate 208 comprises a gate metal selected from one or more of cobalt (Co), tungsten (W), titanium (Ti), molybdenum (Mo), nickel (Ni), ruthenium (Ru), silver (Ag), iridium (Ir), or platinum (Pt). In other specific embodiments, the gate 208 comprises a metal selected from one or more of cobalt (Co), tungsten (W), titanium (Ti), molybdenum (Mo), or ruthenium (Ru). In one or more embodiments, the gate 204 encloses the channel 130 between the first film 106 and the second film 110.

Figure 13:
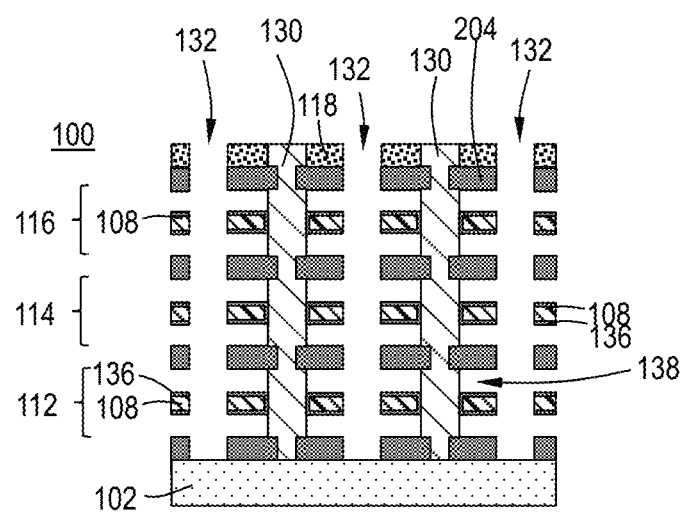
FIG. 13 illustrates a cross-section view of a logic device according to one or more embodiments of the disclosure.

FIG. 13 is a cross-sectional view of a logic device according to one or more embodiments. With reference of FIG. 13, the first film 106 and the second film 110 are removed. In one or more embodiments, the first film 106 and the second film 110 are removed by any suitable process known to the skilled artisan. In one or more embodiments, the first film 106 and the second film 110 are removed by selectively etching the first film 106 and the second film 110 to form a source/drain gap 138.

Figure 14:
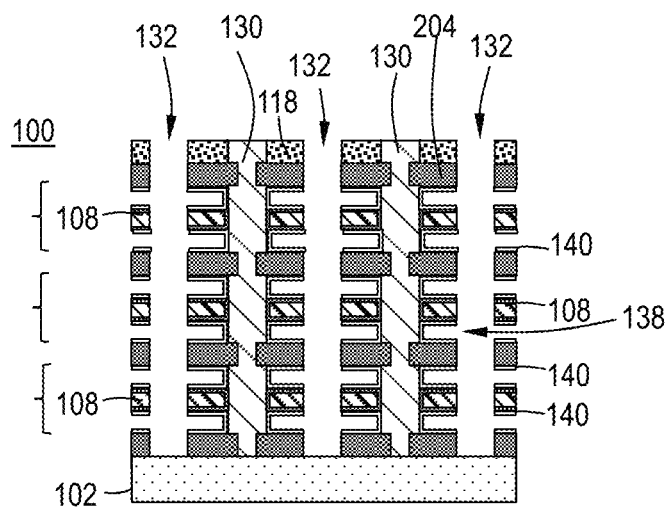
FIG. 14 illustrates a cross-section view of a logic device according to one or more embodiments of the disclosure.

FIG. 14 is a cross-sectional view of a logic device according to one or more embodiments. With reference of FIG. 14, a conformal metal liner 140 is deposited in the source/drain gap 138. The metal liner 140 can be any suitable metal liner material known to the skilled artisan. In one or more embodiments, the metal liner 140 comprises a metal nitride film. In some embodiments, the metal liner 140 comprises one or more of tungsten nitride, tantalum nitride or titanium nitride.

Figure 15:
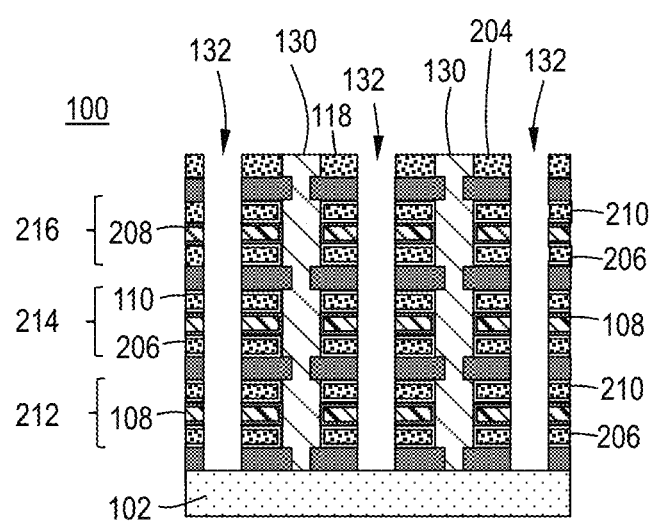
FIG. 15 illustrates a cross-section view of a logic device according to one or more embodiments of the disclosure.

FIG. 15 is a cross-sectional view of a logic device according to one or more embodiments. With reference of FIG. 15, after the metal liner 140 is deposited, the gate source/drain gap 138 is filled with a source/drain material 206/210. The source material 206 and drain material 210 can be any suitable material known to the skilled artisan. In one or more embodiments, the source and drain materials 206, 210 may have more than one layer. For example, the source and drain materials 206, 210 may comprise three layers. In one or more embodiments, the source/drain material 206/210 comprise one or more of copper (Cu), cobalt (Co), tungsten (W), titanium (Ti), molybdenum (Mo), nickel (Ni), ruthenium (Ru), silver (Ag), gold (Au), iridium (Ir), platinum (Pt), phosphorus (P), germanium (Ge), silicon (Si), aluminum (Al), or zirconium (Zr). In some embodiments, the source/drain materials 206/210 comprise a bottom layer of silicon with doped epi (e.g. SiGe, SiP, and the like), a second layer of silicide, which may contain nickel (Ni), titanium (Ti), aluminum (Al), and the like, and a third, or top, layer which may be a metal such as, but not limited to, cobalt, tungsten, ruthenium, and the like.

While it is noted that in this disclosure, the reference numeral 206 refers to the source material and the reference numeral 210 refers to the drain material, as recognized by one skilled in the art, the positioning of the source and drain materials can be switched such that 206 is the drain material and 210 is the source material.

The illustrated process replaces the dummy gate 108 with the metal gate 208 before replacing first film 106 and second film 110 with source/drain materials 206/210. This is merely representative of one possible configuration of the processing method. In some embodiments, the first film 106 and second film 110 are replaced with source/drain materials 206/210 prior to replacing the dummy gate 108 with the metal gate 208. Other variations and alterations known to the skilled artisan are within the scope of the disclosure.

Figure 16:
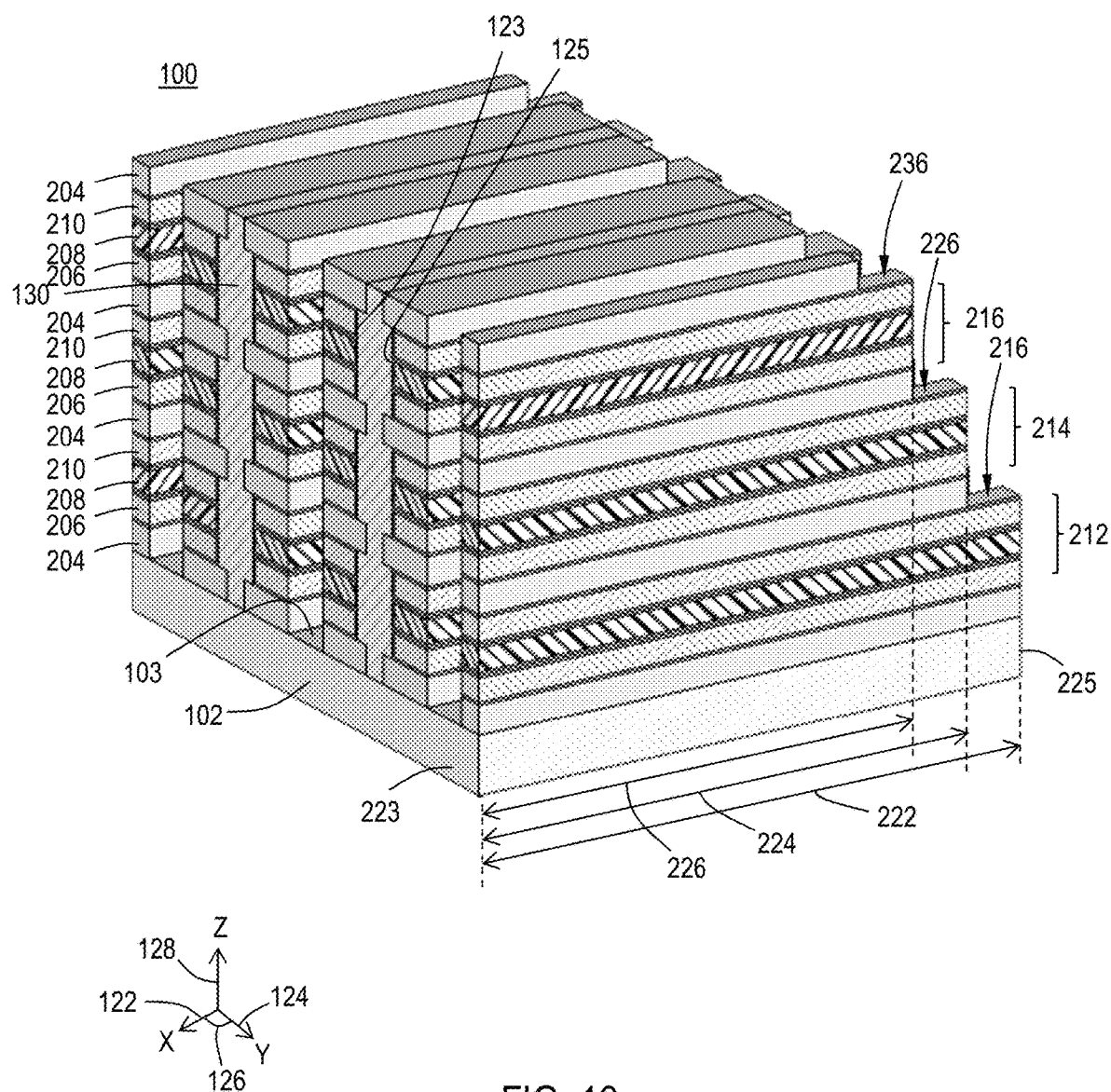
FIG. 16 illustrates a parallel projection view of a logic device according to one or more embodiment of the disclosure.

FIG. 16 illustrates a parallel projection view of a logic device 100 in accordance with one or more embodiment of the disclosure. The logic device 100 includes a substrate 102 having a surface 103 that defines a horizontal plane. In the illustrated embodiment, the horizontal plane lies in the x-y plane formed by the X-axis (direction) 122 and Y-axis (direction) 124, referring to the Cartesian coordinates shown.

An epitaxial channel 130 is formed orthogonally to the horizontal plane (the x-y plane) of the substrate surface 103. The epitaxial channel 130 has a height extending above the substrate surface 103, along the Z-axis (direction) 128, a length extending along a first direction, along X-axis (direction) 122, and a width extending along a second direction, along Y-axis (direction) 124. The length and width of the epitaxial channel being defined by the x-y plane of the horizontal plane of the substrate surface 103.

The epitaxial channel 130 has a first side 123 and a second side 125 on either side of the width of the epitaxial channel 130. The width of the epitaxial channel 130 can vary along the Z-axis (direction) 128, as illustrated. The first side 123 and second side 125 therefore move with the width of the epitaxial channel 130.

A stack of horizontal transistors 212, 214, 216 are formed on the substrate surface 103. Each of the horizontal transistors 212, 214, 216 comprises a source material 206, drain material 210 and a gate 208. Each of the source materials 206, drain materials 210 and gates 208 are horizontal films or layers. As used in this manner, horizontal films or layers have a major plane formed by a surface of the film or layer that is substantially parallel to the horizontal plane of the substrate surface 103.

The embodiment illustrated in FIG. 16 has three stacks of horizontal transistors; however, there can be more or less than three stacks. In some embodiments, there are at least two stacks of horizontal transistors. The first horizontal transistor 212 has a first length 222 and a first step 232. The second horizontal transistor 214 has a second length 224 and a second step 234. The third horizontal transistor 216 has a third length 226 and a third step 236. Each of the horizontal transistors are separated from adjacent transistors by a horizontal isolation layer 204

In some embodiments, the stacks of horizontal transistors on the substrate surface are in contact with the first side 123 or second side 125 of the epitaxial channel 130. Each of the horizontal transistors has a length extending from a first end 223 of the horizontal transistor along the first direction to a second end 225 of the horizontal transistor. The lengths of each of the horizontal transistors decrease with increasing distance from the substrate surface 103. For example, in FIG. 16, the first horizontal transistor 212 has a first length 222 and the second horizontal transistor 214 has a second length 224. The first horizontal transistor 212 is closer to the substrate surface 103 than the second horizontal transistor 214 and the first length 222 is greater than the second length 224. The third horizontal transistor 216 is further from the substrate surface 103 than the second horizontal transistor 214 and the third length 226 is shorter than the second length 224 of the second horizontal transistor 214.

Figure 17:
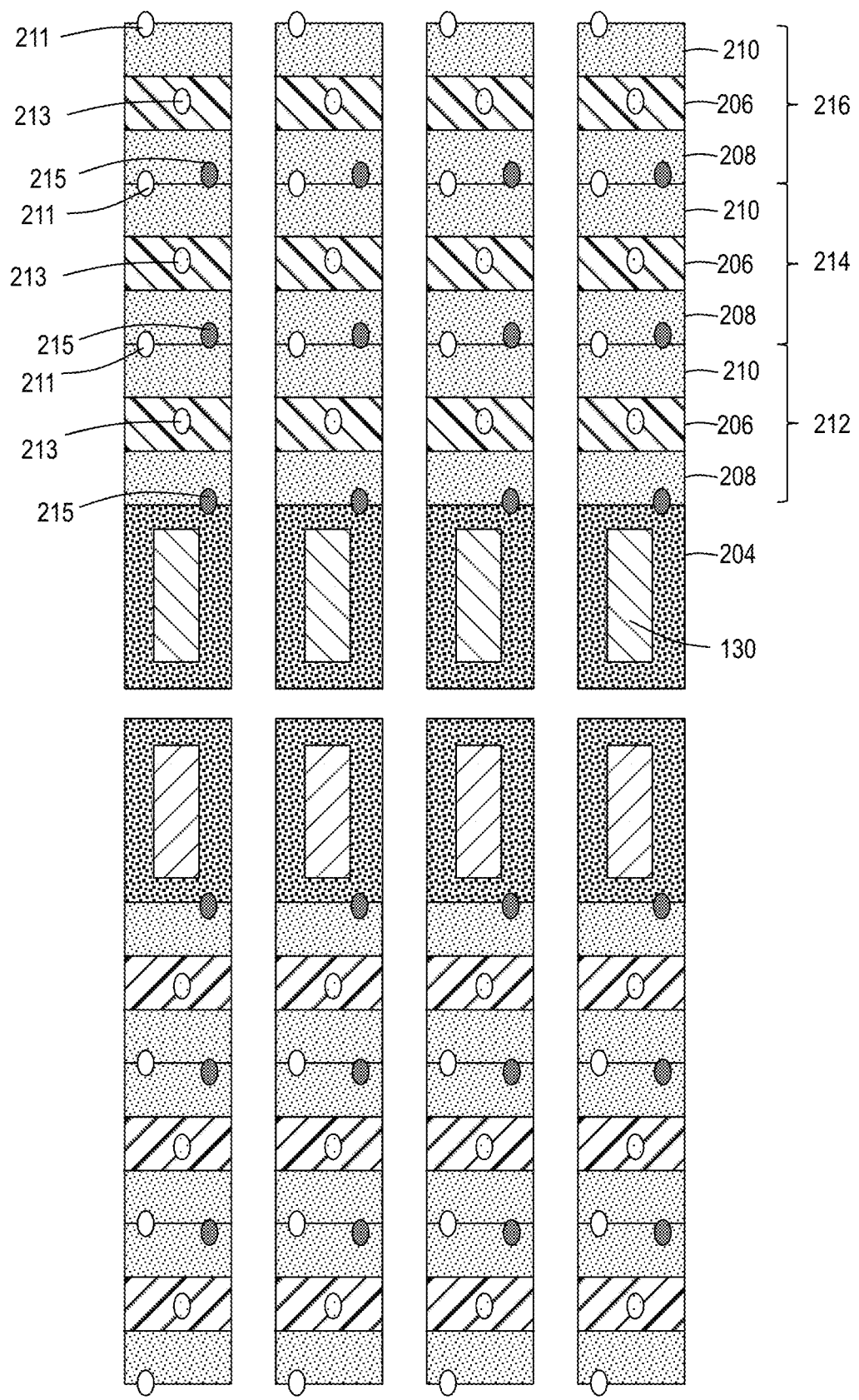
FIG. 17 shows a schematic top view of a three-dimensional logic device according to one or more embodiment of the disclosure.

FIG. 17 illustrates a schematic top view of an array of stair-case stacks of transistors 212, 214, 216 as part of an exemplary logic device. The skilled artisan will be familiar with the formation of logic devices after formation of transistors. Briefly, after finishing a device and forming a stair-case arrangement, the entire device is filled/covered with a dielectric material, a thin etch stop liner, an silicon oxide or low-k dielectric fill. The dielectric material can be planarized, for example, by chemical mechanical planarization. Contacts 211, 213, 215 are etched down through the dielectric to the edge of the stair case to connect source 206, drain 210 and gate 208 for all of the transistors 212, 214, 216 for all of the transistors in the pattern. The contacts 211, 213, 215 of some embodiments are filled with tungsten, cobalt, and/or ruthenium with a liner (e.g., TiN) and polished. Embodiments of the disclosure allow the transistors 212, 214, 216 to be connected in the X, Y and Z-directions. A local layout of transistors in the Z-direction of some embodiments is connected with a first metallization layer. Further connections between transistors in nearby staircases of some embodiments are connected with second and/or third metallization layers (not shown).

The use of the terms "a" and "an" and "the" and similar referents in the context of describing the materials and methods discussed herein (especially in the context of the following claims) are to be construed to cover both the singular and the plural, unless otherwise indicated herein or clearly contradicted by context. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the materials and methods and does not pose a limitation on the scope unless otherwise claimed. No language in the specification should be construed as indicating any non-claimed element as essential to the practice of the disclosed materials and methods.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. In one or more embodiments, the particular features, structures, materials, or characteristics are combined in any suitable manner.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A logic device comprising:
a substrate having a surface defining a horizontal plane;
an epitaxial channel formed orthogonally to the horizontal plane of the substrate surface, the epitaxial channel having a height extending above the substrate surface and a length extending along a first direction of the horizontal plane, the epitaxial channel having a first side and a second side; and
a stack of horizontal transistors on the substrate surface comprising a first horizontal transistor having a first length and a first step, a second horizontal transistor having a second length and a second step, and a third horizontal transistor having a third length and a third step, each of the horizontal transistors separated from adjacent layers by a horizontal isolation layer, each of the horizontal transistors comprising the horizontal isolation layer, a source region, a gate, and a drain region.

2. The logic device of claim 1, further comprising a first contact in electrical communication with the first horizontal transistor, a second contact in electrical communication with the second horizontal transistor and a third contact in electrical communication with the third horizontal transistor.

3. The logic device of claim 2, wherein the first contact contacts the first horizontal transistor at the first step, the second contact contacts the second horizontal transistor at the second step, and the third contact contacts the third horizontal transistor at the third step.

4. The logic device of claim 1, wherein the first length is longer than the second length and the second length is longer than the third length.

5. The logic device of claim 1, wherein the first horizontal transistor is closest to the substrate surface.

6. The logic device of claim 1, wherein the source region and the drain region of each horizontal transistor are separated by the gate.

7. The logic device of claim 6, wherein the gate comprises a high-k/metal gate.

8. The logic device of claim 6, wherein one or more of the source region or the drain region comprises cobalt and a metal liner comprising one or more of titanium, titanium silicide or titanium nitride.

9. The logic device of claim 8, wherein one or more of the source region or the drain region further comprises silicon with a dopant selected from one or more of boron (B), gallium (Ga), phosphorus (P) or arsenic (As).

10. The logic device of claim 6, wherein the gate comprises a gate metal selected from one or more of cobalt (Co), tungsten (W), titanium (Ti), molybdenum (Mo), or ruthenium (Ru).

11. The logic device of claim 1, wherein the length of each of the horizontal transistors extends from a first end of the horizontal transistor, each of the first ends of the horizontal transistors vertically aligned and the first step, second step and third step are located at a second end of the horizontal transistors.

12. The logic device of claim 1, further comprising one or more additional horizontal transistors stacked on top of the third horizontal transistor, each additional horizontal transistor having a shorter length then the adjacent horizontal transistor closer to the substrate surface.

13. A logic device comprising:
a substrate having a surface defining a horizontal plane;

an epitaxial channel formed orthogonally to the horizontal plane of the substrate surface, the epitaxial channel having a height extending above the substrate surface and a length extending along a first direction of the horizontal plane, the epitaxial channel having a first side and a second side; and a stack of horizontal transistors on the substrate surface in contact with the first side or second side of the epitaxial channel, each of the horizontal transistors having a length extending from a first end of the horizontal transistor along the first direction to a second end of the horizontal transistor, the length of each of the horizontal transistors decreasing with increasing distance from the substrate surface, each of the horizontal transistors comprising the horizontal isolation layer, a source region, a gate, and a drain region.

14. The logic device of claim 13, wherein the source region and the drain region of each horizontal transistors are separated by a gate.

15. The logic device of claim 14, wherein the gate comprises a high-k/metal gate.

16. The logic device of claim 14, wherein one or more of the source region or the drain region comprises cobalt and a metal liner comprising one or more of titanium, titanium silicide, or titanium nitride.

17. The logic device of claim 16, wherein one or more of the source region or the drain region further comprises silicon with a dopant selected from one or more of boron (B), gallium (Ga), phosphorus (P) or arsenic (As).

* * * * *